US010613151B2

(12) United States Patent
Jeung et al.

(10) Patent No.: US 10,613,151 B2
(45) Date of Patent: Apr. 7, 2020

(54) BATTERY PACK FUNCTION TEST DEVICE

(71) Applicant: LG CHEM, LTD., Seoul (KR)

(72) Inventors: Seok Won Jeung, Daejeon (KR); Ju Hwan Baek, Daejeon (KR); Choon Kwon Kang, Daejeon (KR); Sung Choon Choo, Daejeon (KR); Hyeong Min Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 294 days.

(21) Appl. No.: 15/559,949

(22) PCT Filed: Jun. 7, 2016

(86) PCT No.: PCT/KR2016/005983
§ 371 (c)(1),
(2) Date: Sep. 20, 2017

(87) PCT Pub. No.: WO2016/195451
PCT Pub. Date: Dec. 8, 2016

(65) Prior Publication Data
US 2018/0074130 A1    Mar. 15, 2018

(30) Foreign Application Priority Data

Jun. 4, 2015 (KR) .................... 10-2015-0079150

(51) Int. Cl.
*G01R 31/396* (2019.01)
*H01M 10/42* (2006.01)
*G01R 31/385* (2019.01)

(52) U.S. Cl.
CPC ...... *G01R 31/396* (2019.01); *H01M 10/4285* (2013.01); *G01R 31/3865* (2019.01)

(58) Field of Classification Search
CPC .. G01R 31/36; G01R 31/385; G01R 31/3865; G01R 31/3644; G01R 31/3647;
(Continued)

(56) References Cited

U.S. PATENT DOCUMENTS 4,377,786 A * 3/1983 Paul .................. G01R 31/3865
324/426
4,451,791 A * 5/1984 Ostroff ................ B07C 5/3412
324/434
(Continued)

FOREIGN PATENT DOCUMENTS

CN    201298571 Y    8/2009
EP    0 102 428 A1    3/1984
(Continued)

OTHER PUBLICATIONS

Translation KR 10-1167096 (Smart Hi-Tech Co Ltd) Jul. 20, 2012 (Year: 2012).*
(Continued)

*Primary Examiner* — Steven L Yeninas
(74) *Attorney, Agent, or Firm* — Birch, Stewart, Kolasch & Birch, LLP

(57) ABSTRACT

Discussed is a battery pack function test device including (a) a loading part for lifting a carrier jig on which a battery pack is loaded from a conveyor and transferring the lifted carrier jig to a testing part, (b) the testing part for testing the functions of the battery pack on the carrier jig transferred from the loading part, and (c) an unloading part for transferring the battery pack to the conveyor in the state in which the battery pack is loaded on the carrier jig upon determining that the battery pack is a good product by the testing part and transferring the battery pack to a defective battery pack stacking part in the state in which the battery pack is loaded on the carrier jig upon determining that the battery pack is a defective product by the testing part.

17 Claims, 2 Drawing Sheets

(58) Field of Classification Search
CPC .......... G01R 31/3648; H01M 10/4207; H01M 10/4228; H01M 10/4285; H01M 10/482; H01M 10/48
USPC .................................................. 324/426, 434
See application file for complete search history.

(56) References Cited

U.S. PATENT DOCUMENTS

| | | | | |
|---|---|---|---|---|
| 2011/0273181 | A1* | 11/2011 | Park | H02J 7/0008 324/429 |
| 2011/0309837 | A1* | 12/2011 | Nishihara | H01M 2/1061 324/426 |
| 2011/0316546 | A1* | 12/2011 | Bruno | G01R 31/385 324/426 |
| 2013/0305835 | A1* | 11/2013 | Jansky | H01M 10/4285 73/818 |
| 2014/0017528 | A1* | 1/2014 | Uehara | H01M 2/202 429/61 |
| 2016/0079635 | A1* | 3/2016 | Niwa | H01M 2/204 324/426 |

FOREIGN PATENT DOCUMENTS

| | | |
|---|---|---|
| EP | 1 638 160 B1 | 2/2012 |
| JP | S59-61785 A | 4/1984 |
| JP | 63-299061 A | 12/1986 |
| JP | 2010-186568 A | 8/2010 |
| JP | 2013-149440 A | 8/2013 |
| KR | 10-0524419 B1 | 10/2005 |
| KR | 10-2009-0123633 A | 12/2009 |
| KR | 10-1167096 B1 | 7/2012 |
| KR | 10-2014-0013675 A | 2/2014 |
| KR | 10-2015-0045621 A | 4/2015 |

OTHER PUBLICATIONS

Translation KR 10-0524419 (Elentec Co Ltd) Oct. 26, 2005 (Year: 2005).*

International Search Report for PCT/KR2016/005983 (PCT/ISA/210) dated Sep. 12, 2016.

* cited by examiner

[FIG. 1]
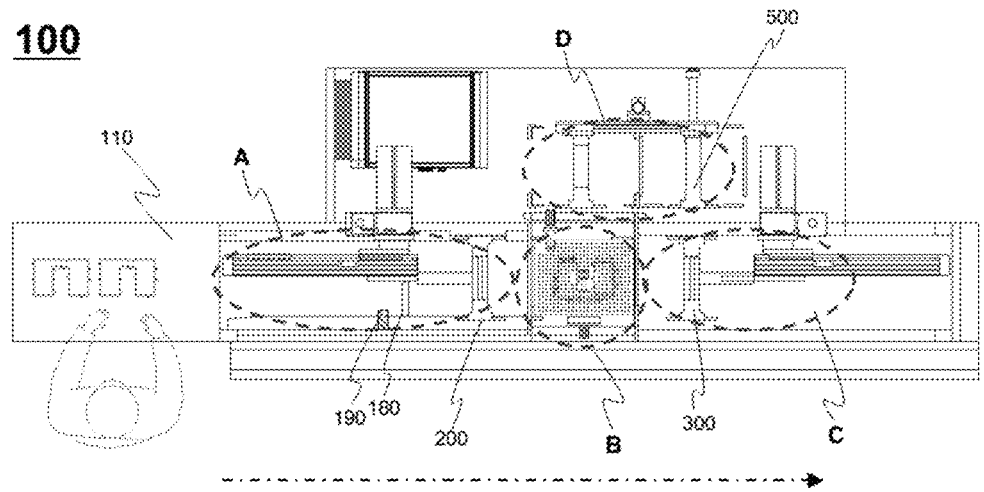
[FIG. 2]
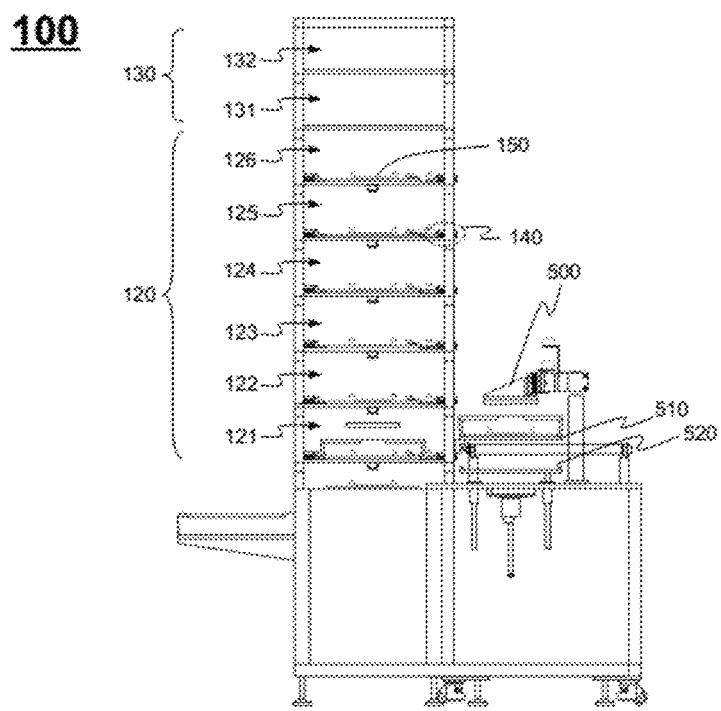

[FIG. 3]
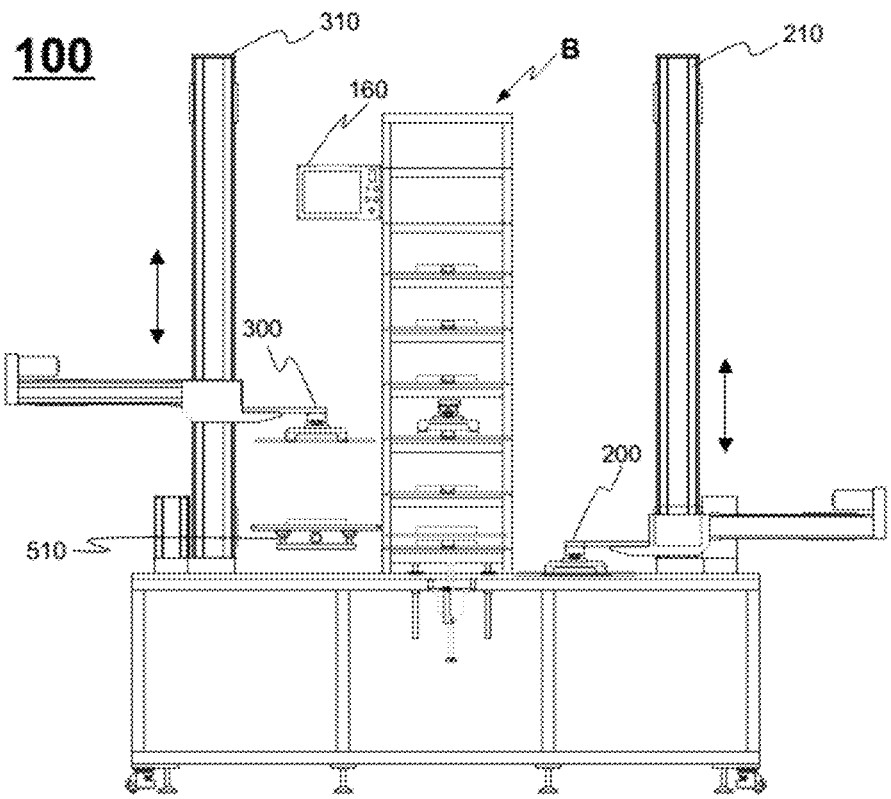
[FIG. 4]
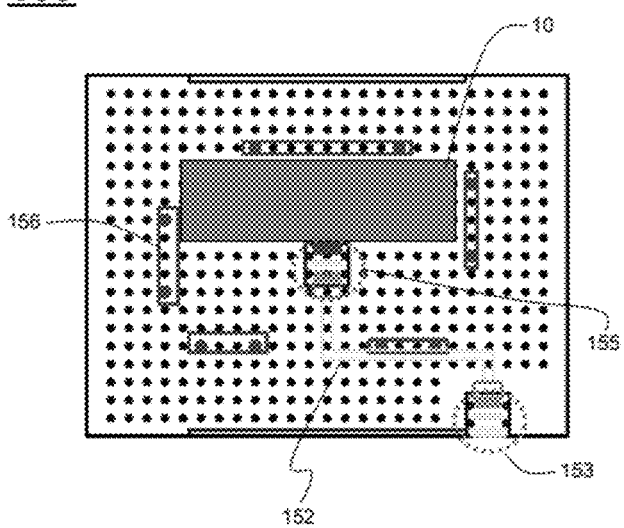

BATTERY PACK FUNCTION TEST DEVICE

CROSS-REFERENCE TO RELATED APPLICATIONS

This application claims the benefit of Korean Patent Application No. 10-2015-0079150 filed on Jun. 4, 2015 with the Korean Intellectual Property Office, the disclosure of which is herein incorporated by reference in its entirety.

TECHNICAL FIELD

The present invention relates to a battery pack function test device.

BACKGROUND

In recent years, secondary batteries, which can be charged and discharged, have been widely used as an energy source for wireless mobile devices. In addition, such secondary batteries have attracted considerable attention as an energy source for electric vehicles and hybrid electric vehicles, which have been developed to solve problems, such as air pollution, caused by existing gasoline and diesel vehicles using fossil fuel. Therefore, secondary batteries are being applied to an increasing number of applications owing to advantages thereof and, in the future, secondary batteries are expected to be applied to even more applications and products.

Based on the construction of electrodes and an electrolytic solution, secondary batteries may be classified into a lithium ion battery, a lithium ion polymer battery, and a lithium polymer battery. In particular, the lithium ion polymer battery has been increasingly used because the lithium ion polymer battery has a low possibility of leakage of an electrolytic solution and can be easily manufactured. Based on the shape of a battery case, on the other hand, secondary batteries may also be classified into a cylindrical battery having an electrode assembly mounted in a cylindrical metal container, a prismatic battery having an electrode assembly mounted in a prismatic metal container, and a pouch-shaped battery having an electrode assembly mounted in a pouch-shaped case made of an aluminum laminate sheet. The electrode assembly, which is mounted in the battery case, is a power generating element that includes a positive electrode, a negative electrode, and a separator disposed between the positive electrode and the negative electrode and that can be charged and discharged. The electrode assembly is classified as a jelly-roll type electrode assembly, which is configured to have a structure in which a long sheet type positive electrode and a long sheet type negative electrode, to which active materials are applied, are wound in the state in which a separator is disposed between the positive electrode and the negative electrode, or a stacked type electrode assembly, which is configured to have a structure in which a plurality of positive electrodes having a predetermined size and a plurality of negative electrodes having a predetermined size are sequentially stacked in the state in which separators are disposed respectively between the positive electrodes and the negative electrodes.

Meanwhile, one of the most important factors in producing secondary batteries is quality control to determine whether secondary batteries exhibit desired performance and safety. Quality control is determining whether secondary batteries exhibit normal charge and discharge performance to sort good products from defective products. High-quality secondary batteries may be manufactured through such quality control.

In most cases, a worker manually tests the quality of battery packs in the state in which the battery packs are loaded on a jig in a workshop. In the case in which the worker manually tests the functions of the battery packs, however, the possibility of the battery pack being defective is increased due to errors in manual work or worker's mistakes, which leads to a reduction in production efficiency of the battery packs.

Therefore, there is a high necessity for a battery pack function test device that is capable of effectively testing the functions of battery packs through an automated process, thereby reducing the defect rate of the battery packs and thus greatly improving efficiency in production of the battery pack.

DISCLOSURE

Technical Problem

Therefore, the present invention has been made to solve the above problems and other technical problems that have yet to be resolved.

Specifically, it is an object of the present invention to provide an automated battery pack function test device configured such that a loading part, a testing part, and an unloading part are sequentially operated to test the functions of battery packs, whereby the functions of the battery packs are effectively tested while battery packs determined to be good products and defective products are efficiently sorted.

Technical Solution

In accordance with one aspect of the present invention, the above and other objects can be accomplished by the provision of a battery pack function test device including (a) a loading part for lifting a carrier jig on which a battery pack is loaded from a conveyor and transferring the lifted carrier jig to a testing part, (b) the testing part for testing the functions of the battery pack on the carrier jig transferred from the loading part, and (c) an unloading part for transferring the battery pack to the conveyor in the state in which the battery pack is loaded on the carrier jig upon determining that the battery pack is a good product by the testing part and transferring the battery pack to a defective battery pack stacking part in the state in which the battery pack is loaded on the carrier jig upon determining that the battery pack is a defective product by the testing part.

Consequently, the battery pack function test device according to the present invention is automated. That is, the loading part, the testing part, and the unloading part may be sequentially operated to test the functions of battery packs, whereby the functions of the battery packs are effectively tested while battery packs determined to be good products and defective products are efficiently sorted.

According to the present invention, the battery pack may include at least one plate-shaped battery cell.

In a concrete example, the plate-shaped battery cell may be a pouch-shaped battery cell configured to have a structure in which an electrode assembly is mounted in a battery case made of a laminate sheet including a resin layer and a metal layer. For example, the plate-shaped battery cell may be a lithium secondary battery.

For reference, the lithium secondary battery may include a positive electrode, a negative electrode, a separator, and a non-aqueous electrolytic solution containing lithium salt.

For example, the positive electrode according to the present invention may be manufactured by mixing a positive electrode mixture with a solvent, such as NMP, to prepare a slurry, applying the slurry to a positive electrode current collector, and drying and pressing the slurry.

The positive electrode mixture may selectively include a conductive agent, a binder, and a filler, in addition to a positive electrode active material.

The positive electrode active material, which is a material that causes an electrochemical reaction, may be a lithium transition metal oxide including two or more transition metals. For example, the positive electrode active material may be, without being limited to, a layered compound replaced by one or more transition metals, such as a lithium cobalt oxide ($LiCoO_2$) or a lithium nickel oxide ($LiNiO_2$); a lithium manganese oxide replaced by one or more transition metals; a lithium nickel oxide represented by a chemical formula $LiNi_{1-y}M_yO_2$ (where M=Co, Mn, Al, Cu, Fe, Mg, B, Cr, Zn, or Ga, at least one of which is included, and $0.01 \leq y \leq 0.7$); a lithium nickel cobalt manganese composite oxide represented by a chemical formula $Li_{1+z}Ni_bMn_cCo_{1-(b+c+d)}M_dO_{(2-e)}A_e$ (where $-0.5 \leq z \leq 0.5$, $0.1 \leq b \leq 0.8$, $0.1 \leq c \leq 0.8$, $0 \leq d \leq 0.2$, $0 \leq e \leq 0.2$, b+c+d<1, M=Al, Mg, Cr, Ti, Si, or Y, and A=F, P, or Cl), such as $Li_{1+z}Ni_{1/3}Co_{1/3}Mn_{1/3}O_2$, $Li_{1+z}Ni_{0.4}Mn_{0.4}Co_{0.2}O_2$; or an olivine-based lithium metal phosphate represented by a chemical formula $Li_{1+x}M_{1-y}M'_yPO_{4-z}X_z$ (where M=transition metal, preferably Fe, Mn, Co, or Ni, M'=Al, Mg, or Ti, X=F, S, or N, and $-0.5 \leq x \leq +0.5$, $0 \leq y \leq 0.5$, $0 \leq z \leq 0.1$).

The conductive agent is generally added so that the conductive agent has 1 to 30 weight % based on the total weight of the compound including the positive electrode active material. The conductive agent is not particularly restricted so long as the conductive agent exhibits high conductivity while the conductive agent does not induce any chemical change in a battery to which the conductive agent is applied. For example, graphite, such as natural graphite or artificial graphite; carbon black, such as carbon black, acetylene black, Ketjen black, channel black, furnace black, lamp black, or summer black; conductive fiber, such as carbon fiber or metallic fiber; metallic powder, such as carbon fluoride powder, aluminum powder, or nickel powder; conductive whisker, such as a zinc oxide or potassium titanate; a conductive metal oxide, such as a titanium oxide; or conductive materials, such as polyphenylene derivatives, may be used as the conductive agent.

The binder is a component assisting in binding between the active material and the conductive agent and in binding with the current collector. The binder is generally added in an amount of 1 to 30 weight % based on the total weight of the compound including the positive electrode active material. As examples of the binder, there may be used polyvinylidene fluoride, polyvinyl alcohol, carboxymethylcellulose (CMC), starch, hydroxypropylcellulose, regenerated cellulose, polyvinyl pyrollidone, tetrafluoroethylene, polyethylene, polypropylene, ethylene-propylene-diene terpolymer (EPDM), sulfonated EPDM, styrene butadiene rubber, fluoro rubber, and various copolymers.

The filler is an optional component used to inhibit expansion of the positive electrode. There is no particular limit on the filler so long as it does not cause chemical changes in a battery to which the filler is applied and is made of a fibrous material. As examples of the filler, there may be used olefin polymers, such as polyethylene and polypropylene; and fibrous materials, such as glass fiber and carbon fiber.

In general, the positive electrode current collector has a thickness of 3 to 500 µm. The positive electrode current collector is not particularly restricted so long as the positive electrode current collector exhibits high conductivity while the positive electrode current collector does not induce any chemical change in a battery to which the positive electrode current collector is applied. For example, the positive electrode current collector may be made of stainless steel, aluminum, nickel, titanium, or plastic carbon. Alternatively, the positive electrode current collector may be made of aluminum or stainless steel, the surface of which is treated with carbon, nickel, titanium, or silver. The positive electrode current collector may have a micro-scale uneven pattern formed at the surface thereof so as to increase the adhesive force of the positive electrode active material. The positive electrode current collector may be configured in various forms, such as a film, a sheet, a foil, a net, a porous body, a foam body, and a non-woven fabric body.

The negative electrode is manufactured, for example, by applying a negative electrode mixture including a negative electrode active material to a negative electrode current collector and drying the negative electrode mixture. The above-described conductive agent, the binder, and the filler may be included in the negative electrode mixture as needed.

For example, carbon and graphite materials, such as natural graphite, artificial graphite, expandable graphite, carbon fiber, hard carbon, carbon black, carbon nanotubes, fullerenes, and activated carbon; metals alloyable with lithium, such as Al, Si, Sn, Ag, Bi, Mg, Zn, In, Ge, Pb, Pd, Pt, and Ti, and compounds including these elements; complexes of metals and compounds thereof and complexes of carbon and graphite materials; and lithium-containing nitrides may be used as the negative electrode active material. Thereamong, a carbon-based active material, a silicon-based active material, a tin-based active material, or a silicon-carbon-based active material is more preferable and may be used alone or in combinations of two or more thereof.

The negative electrode current collector generally has a thickness of 3 to 500 µm. The negative electrode current collector is not particularly restricted so long as the negative electrode current collector exhibits high conductivity while the negative electrode current collector does not induce any chemical change in a battery to which the negative electrode current collector is applied. For example, the negative electrode current collector may be made of copper, stainless steel, aluminum, nickel, titanium, or plastic carbon. Alternatively, the negative electrode current collector may be made of copper or stainless steel, the surface of which is treated with carbon, nickel, titanium, or silver, or an aluminum-cadmium alloy. In the same manner as in the positive electrode current collector, the negative electrode current collector may have a micro uneven pattern formed at the surface thereof so as to increase the adhesive force of the negative electrode active material. The negative electrode current collector may be configured in various forms, such as a film, a sheet, a foil, a net, a porous body, a foam body, and a non-woven fabric body.

The separator is interposed between the positive electrode and the negative electrode. As the separator, for example, an insulative thin film exhibiting high ion permeability and high mechanical strength may be used. The separator generally has a pore diameter of 0.01 to 10 µm and a thickness of 5 to 300 µm. As the material for the separator, for example, a sheet or non-woven fabric made of olefin polymer, such as polypropylene, which exhibits chemical resistance and hydrophobicity, glass fiber, or polyethylene is used. In the case in which a solid electrolyte, such as a polymer, is used as an electrolyte, the solid electrolyte may also function as the separator.

The non-aqueous electrolytic solution containing lithium salt is composed of an electrolytic solution and lithium salt. As the electrolytic solution, a non-aqueous organic solution, an organic solid electrolyte, or an inorganic solid electrolyte may be used.

As examples of the non-aqueous electrolytic solution, mention may be made of non-protic organic solvents, such as N-methyl-2-pyrollidinone, propylene carbonate, ethylene carbonate, butylene carbonate, dimethyl carbonate, diethyl carbonate, gamma-butyro lactone, 1,2-dimethoxy ethane, tetrahydroxy Franc, 2-methyl tetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxy methane, dioxolane derivatives, sulfolane, methyl sulfolane, 1,3-dimethyl-2-imidazolidinone, propylene carbonate derivatives, tetrahydrofuran derivatives, ether, methyl propionate, and ethyl propionate.

As examples of the organic solid electrolyte, mention may be made of polyethylene derivatives, polyethylene oxide derivatives, polypropylene oxide derivatives, phosphoric acid ester polymers, poly agitation lysine, polyester sulfide, polyvinyl alcohols, polyvinylidene fluoride, and polymers containing ionic dissociation groups.

As examples of the inorganic solid electrolyte, mention may be made of nitrides, halides, and sulphates of lithium (Li), such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a material that is readily soluble in the above-mentioned non-aqueous electrolytic solution, and may include, for example, $LiCl$, $LiBr$, $LiI$, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, lithium tetraphenyl borate, and imide.

In addition, in order to improve charge and discharge characteristics and flame retardancy, for example, pyridine, triethylphosphite, triethanolamine, cyclic ether, ethylenediamine, n-glyme, hexaphosphoric triamide, nitrobenzene derivatives, sulfur, quinone imine dyes, N-substituted oxazolidinone, N,N-substituted imidazolidine, ethylene glycol dialkyl ether, ammonium salts, pyrrole, 2-methoxy ethanol, aluminum trichloride, or the like may be added to the electrolytic solution. According to circumstances, in order to impart incombustibility, the electrolytic solution may further include halogen-containing solvents, such as carbon tetrachloride and ethylene trifluoride. Furthermore, in order to improve high-temperature retention characteristics, the electrolytic solution may further include carbon dioxide gas.

In a concrete example, the carrier jig may include a main body receiving and fixing part for receiving and fixing the main body of the battery pack and a connector fixing part, to which a connector of the battery pack is mounted, and one end of the connector may be mounted to the connector fixing part so as to be exposed to the outside of the carrier jig.

That is, the outwardly exposed end of the connector of the battery pack may be connected to an external device in the state in which the battery pack is stably fixed to the main body receiving and fixing part of the carrier jig in order to test the functions of the battery pack.

Meanwhile, the loading part may include a barcode identifier for determining whether or not the battery pack is effective using a barcode in the state in which the carrier jig is located on the conveyor and a first clamping unit for transferring the carrier jig, on which the battery pack is loaded, to the testing part upon the barcode identifier determining that the battery pack is effective.

The first clamping unit may be configured to be movable in a direction in which the conveyor is moved (an X-axis direction) and in a direction perpendicular to the ground (a Z-axis direction).

According to circumstances, a stopper for stopping movement of the carrier jig on the conveyor to determine whether or not the battery pack is effective may be mounted at one side of the barcode identifier.

The battery pack may be discharged manually or automatically upon the barcode identifier determining that the battery pack is not effective.

According to the present invention, the testing part may include a test shelf including at least two channels, in each of which a carrier jig, on which a battery pack is loaded such that functions of the battery pack are tested, is mounted, an auxiliary shelf located above the test shelf, the auxiliary shelf including at least one channel, in which a carrier jig, on which a battery pack to be tested is loaded, is located, and jig fixing members for fixing the carrier jigs in the respective channels of the test shelf and the auxiliary shelf such that the carrier jigs do not move when the functions of the battery pack are tested. The channels may be arranged perpendicular to the ground.

In a concrete example, the test shelf may include four or more channels, and the auxiliary shelf may include two or more channels.

A display part for outputting the test results of the battery pack in real time may be further mounted at one side of the testing part. Consequently, it is possible to check the test results of the battery packs in the respective channels of the test shelf through the display part in real time.

In a concrete example, a test pin for testing the functions of the battery pack may be located at one side of the test shelf, and the test pin may be automatically connected to the connector of the battery pack in response to the operation of each of the jig fixing members.

That is, the test pin is formed at a region that corresponds to the connector of the battery pack. Consequently, the test pin may be automatically connected to the connector of the battery pack as each of the jig fixing members is brought into tight contact with a corresponding carrier jig without the worker manually connecting the test pin to the connector.

According to the present invention, the first clamping unit of the loading part may be configured to selectively locate the carrier jig in any one empty channel selected from among the channels of the testing part. In an example, the first clamping unit of the loading part may be configured to first locate the carrier jig in the lowermost channel selected from among the channels of the testing part.

Consequently, the carrier jig may be first supplied to the lowermost channel selected from among the channels of the testing part, whereby it is possible to reduce the loading time of the carrier jig and thus to greatly increase the working speed.

In addition, the unloading part according to the present invention may include a second clamping unit for withdrawing the carrier jig, on which the battery pack is loaded, from the testing part after the functions of the battery pack have been tested and transferring the withdrawn carrier jig to the conveyor or a defective product discharging part.

The second clamping unit may be configured to be movable in the X-axis direction and in the Z-axis direction.

In the above structure, the defective product discharging part may include a transfer plate, on the upper surface of which a carrier jig, on which a defective battery pack transferred from the testing part by the second clamping unit is loaded, is loaded, and a third clamping unit for transferring the carrier jig, on which the battery pack is loaded, from the transfer plate to a defective battery pack stacking part.

In a concrete example, the transfer plate may be configured to be movable in a Y-axis direction, which is perpendicular to the X-axis direction and to the Z-axis direction, and the transfer plate may move toward the conveyor to receive the carrier jig, on which the battery pack is loaded, from the second clamping unit upon determining that the battery pack is defective.

The defective battery pack stacking part may be located at one side of the testing part and may be configured to have a receiving structure in which carrier jigs on which battery packs determined to be defective products are loaded are sequentially stacked.

In accordance with other aspects of the present invention, there are provided a battery pack determined to be a good product by the battery pack function test device and a device including the battery pack as a power source. For example, the device may be any one selected from among the group consisting of an electric vehicle, a hybrid electric vehicle, a plug-in hybrid electric vehicle, and a power storage apparatus.

The structure and manufacturing method of the device are well known in the art to which the present invention pertains, and a detailed description thereof will be omitted.

BRIEF DESCRIPTION OF DRAWINGS

The above and other objects, features and other advantages of the present invention will be more clearly understood from the following detailed description taken in conjunction with the accompanying drawings, in which:

FIG. 1 is a plan view showing a battery pack function test device according to an embodiment of the present invention;

FIG. 2 is a side view of the battery pack function test device shown in FIG. 1;

FIG. 3 is a front view of the battery pack function test device shown in FIG. 1; and FIG. 4 is a plan view showing a carrier jig according to an embodiment of the present invention.

BEST MODE

Now, exemplary embodiments of the present invention will be described in detail with reference to the accompanying drawings. It should be noted, however, that the scope of the present invention is not limited by the illustrated embodiments.

FIG. 1 is a plan view schematically showing a battery pack function test device according to an embodiment of the present invention, and FIGS. 2 and 3 are a side view and a front view of the battery pack function test device shown in FIG. 1.

Referring to these figures, a battery pack function test device 100 according to the present invention includes a loading part A for lifting a carrier jig 150, on which a battery pack 10 is loaded, from a conveyor 110 and transferring the lifted carrier jig to a testing part B, the testing part B for testing the functions of the battery pack 10 on the carrier jig 150, and an unloading part C for transferring a battery pack 10 determined to be a good product by the testing part B to the conveyor 110 in the state in which the battery pack 10 is loaded on the carrier jig 150 and transferring a battery pack 10 determined to be a defective product by the testing part B to a defective product discharging part D.

The loading part A according to the present invention includes a barcode identifier 190 for determining whether or not a battery pack is effective using a barcode in the state in which a carrier jig 150 is located on the upper surface of the conveyor 110 and a first clamping unit 200 for transferring a carrier jig 150 on which a battery pack 10 determined to be effective by the barcode identifier 190 is loaded to the testing part B.

In addition, a stopper 180 for stopping the movement of a carrier jig 150 I order to determine whether or not a battery pack is effective is mounted at one side of the barcode identifier 190.

Specifically, the middle portion of the first clamping unit 200 is mounted so as to be movable vertically upward and downward in the state of being fixed to a vertical fixing bar 210, and one end of the first clamping unit 200 is formed in the shape of tongs that are capable of easily gripping a carrier jig 150. Consequently, the first clamping unit 200 may move upward and downward along the vertical fixing bar 210 to transfer a carrier jig 150, on which a battery pack 10 is located, to a corresponding channel of the testing part B in the state of easily gripping the carrier jig 150.

The testing part B according to the present invention includes a test shelf 120, which includes six channels 121, 122, 123, 124, 125, and 126, in each of which a carrier jig 150, on which a battery pack 10 is loaded such that the functions of the battery pack 10 are tested, is mounted, an auxiliary shelf 130 located above the test shelf 120, the auxiliary shelf 130 including two channels 131 and 132, in which carrier jigs 150, on which battery packs 10 to be tested are loaded, are located, and jig fixing members 140 for fixing the carrier jigs 150 in the channels of the test shelf 120 and the auxiliary shelf 130 such that the carrier jigs 150 do not move when the functions of the battery packs are tested.

The unloading part C according to the present invention includes a second clamping unit 300 for withdrawing a carrier jig 150 on which a battery pack 10 the functions of which have been tested is loaded from the testing part B and transferring the withdrawn carrier jig to the conveyor 110 or the defective product discharging part D.

Specifically, the middle portion of the second clamping unit 300 is mounted so as to be movable vertically upward and downward in the state of being fixed to a vertical fixing bar 310, and one end of the second clamping unit 300 is formed in the shape of tongs that are capable of easily gripping a carrier jig 150. Consequently, the second clamping unit 300 may move upward and downward along the vertical fixing bar 310 to selectively withdraw a carrier jig 150 on which a battery pack the functions of which have been tested is located to a corresponding channel of the testing part B in the state of easily gripping the carrier jig 150.

In the structure of the unloading part C, the defective product discharging part D includes a transfer plate 510, on the upper surface of which a carrier jig 150, on which a defective battery pack 10 transferred from the testing part B by the second clamping unit 300 is loaded, is loaded, and a third clamping unit 500 for transferring the carrier jig 150, on which the battery pack is loaded, from the transfer plate 510 to a defective battery pack stacking part 520.

Specifically, the transfer plate 510 is configured to be movable in the direction Y perpendicular to the direction X in which the carrier jig 150 on the conveyor 110 is moved and in the upward and downward direction Z. The transfer plate 510 receives a battery pack 10 determined to be a defective product by the testing part B from the second clamping unit 300.

In addition, one side of the third clamping unit 500 is mounted so as to be movable to the defective battery pack stacking part 520 in the state of being fixed to a horizontal fixing bar, and one end of the third clamping unit 500 is formed in the shape of tongs that are capable of easily gripping a carrier jig 150. Consequently, the third clamping unit 500 may move in one direction along the horizontal fixing bar to transfer a carrier jig 150 on which a battery pack 10 determined to be a defective product is located to the defective battery pack stacking part 520 in the state in which the tongs-shaped portion of the third clamping unit 500 easily grips the carrier jig 150.

In the above structure, the defective battery pack stacking part 520 is located adjacent to one side of the testing part B, and is configured to have a receiving structure in which carrier jigs on which battery packs determined to be defective products are loaded are sequentially stacked. Consequently, the carrier jigs 150 transferred from the third clamping unit 500 are automatically sorted without worker's manual discharge.

Meanwhile, each of the carrier jigs 150 according to the present invention includes main body receiving and fixing parts 156 for receiving and supporting the main body of a battery pack 10 so as not to move and a connector fixing part 155, to which a connector 152 of the battery pack is mounted.

Specifically, each of the carrier jigs 150 is generally configured to have a plate-shaped structure. Each of the carrier jigs 150 has a horizontal length of 400 mm and a vertical length of 300 mm. The main body receiving and fixing parts 156 are partially formed along the outer edge of the main body of the battery pack 10. During testing of the battery pack, therefore, the carrier jig 150 may be stably fixed.

A connector fixing part 155, to which the battery pack 10 is electrically connected such that the functions of the battery pack are tested, is provided at one side of the battery pack. One end 153 of the connector 152 coupled to the connector fixing part 155 is exposed to the outside of the carrier jig 150 in the state in which the connector 152 is bent along the main body receiving and fixing parts 156. Consequently, a test pin may be connected to the end 153 of the connector 152 in order to test the functions of the battery pack 10.

Hereinafter, the operation of the battery pack function test device according to the present invention will be described in detail with reference to FIGS. 1 to 4.

First, a worker mounts a battery pack 10 on a carrier jig 150, in the state in which a connector of the battery pack is connected to the carrier jig 150, and locates the carrier jig 150 on the conveyor 110, which moves in one direction. While the carrier jig 150 is moved, the stopper 180, which is mounted at one side of the barcode identifier 190, moves downward to temporarily stop the movement of the carrier jig 150 in order to determine whether the battery pack 10 is effective using the barcode identifier 190, which is mounted at one side of the carrier jig 150.

Subsequently, the stopper 180 moves upward, the carrier jig 150, on which the battery pack 10 the effectiveness of which has been tested is loaded, is transferred to the test shelf 120 and is brought into tight contact with one side of the lower end of the test shelf 120, and the transfer of the carrier jig 150 is stopped.

Subsequently, the carrier jig 150 is transferred to an empty channel selected from among the six channels 121, 122, 123, 124, 125, and 126 of the test shelf 120 in the state in which the carrier jig 150 is gripped by the first clamping unit 200 such that the functions of the battery pack are tested. In the case in which the six channels of the test shelf 120 are all being used, the carrier jig 150 is transferred to the auxiliary shelf 130, which is located above the test shelf 120, and is transferred to the first channel of the test shelf 120 in which a test has been completed.

When the carrier jig 150 is transferred to the empty channel by the first clamping unit 200, the jig fixing member 140, which is provided at one side of each of the six channels 121, 122, 123, 124, 125, and 126, is brought into tight contact with the outer surface of the carrier jig 150. At this time, the test pin is connected to one end 153 of the connector 152, which is connected to the battery pack 10, such that the functions of the battery pack are tested.

Meanwhile, while tests are being performed in the test shelf 120, the test results of the battery pack 10 in each of the channels are output in real time through a display part 160 mounted at one side of the test shelf 120. Specifically, whether the battery pack 10 is a good product or a defective product is output through the display part 160.

Upon determining that the battery pack 10 in any one of the channels of the test shelf 120 is a good product, the second clamping unit 300 withdraws the carrier jig 150 located in the corresponding channel of the test shelf 120 and returns the withdrawn carrier jig 150 on the conveyor 110, whereby the function test is completed.

On the other hand, upon determining that the battery pack 10 in any one of the channels of the test shelf 120 is a defective product, the second clamping unit 300 withdraws the carrier jig 150 located in the corresponding channel of the test shelf 120 outside the test shelf 120 and the transfer plate 510 moves in the downward direction of the second clamping unit 300 (i.e. in a direction perpendicular to the direction in which the carrier jig is moved), receives the carrier jig on which the battery pack determined to be a defective product is loaded, and returns to the original position thereof. Finally, the third clamping unit 500 moves toward the defective battery pack stacking part 520, which is mounted at one side of the transfer plate 510, along the horizontal fixing bar, and transfers the carrier jig transferred to the transfer plate 510, whereby carrier jigs on which defective battery packs are loaded are sequentially stacked in the defective battery pack stacking part 520.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, the battery pack function test device according to the present invention is automated. That is, the loading part, the testing part, and the unloading part are sequentially operated to test the functions of battery packs, whereby the functions of the battery packs are effectively tested while battery packs determined to be good products and defective products are efficiently sorted.

The invention claimed is:

1. A battery pack function test device comprising:
   (a) a loading part for lifting a carrier jig on which a battery pack is loaded from a conveyor and transferring the lifted carrier jig to a testing part;
   (b) the testing part for testing functions of the battery pack on the carrier jig transferred from the loading part; and
   (c) an unloading part for transferring the battery pack to the conveyor in a state in which the battery pack is loaded on the carrier jig upon determining that the battery pack is a good product by the testing part and transferring the battery pack to a defective battery pack stacking part in a state in which the battery pack is loaded on the carrier jig upon determining that the battery pack is a defective product by the testing part, wherein the testing part comprises:
      a test shelf comprising at least two channels, in each of which a carrier jig, on which a battery pack is loaded such that functions of the battery pack are able to be tested, is mounted for the battery pack to be tested;
      an auxiliary shelf located above the test shelf, the auxiliary shelf comprising at least one channel, in which a carrier jig, on which a battery pack to be tested is loaded, is located and held in reserve without the battery pack being tested; and
      jig fixing members for fixing the carrier jigs in the respective channels of the test shelf and the auxiliary shelf such that the carrier jigs do not move when the functions of the battery pack are tested, and
   wherein the channels are arranged perpendicular to a ground.

2. The battery pack function test device according to claim 1, wherein the battery pack comprises at least one plate-shaped battery cell.

3. The battery pack function test device according to claim 1, wherein the carrier jig comprises a main body receiving and fixing part for receiving and fixing a main body of the battery pack and a connector fixing part, to which a connector of the battery pack is mounted, and
   wherein one end of the connector is mounted to the connector fixing part so as to be exposed to an outside of the carrier jig.

4. The battery pack function test device according to claim 1, wherein the loading part comprises:
   a barcode identifier for determining whether or not the battery pack is effective using a barcode in a state in which the carrier jig is located on the conveyor; and
   a first clamping unit for transferring the carrier jig, on which the battery pack is loaded, to the testing part upon the barcode identifier determining that the battery pack is effective, the first clamping unit including a tong to grip the carrier jig.

5. The battery pack function test device according to claim 4, wherein the first clamping unit is configured to be movable in a direction in which the conveyor is moved (an X-axis direction) and in a direction perpendicular to a ground (a Z-axis direction).

6. The battery pack function test device according to claim 4, wherein a stopper for stopping movement of the carrier jig on the conveyor to determine whether or not the battery pack is effective is mounted at one side of the barcode identifier.

7. The battery pack function test device according to claim 4, wherein the battery pack is discharged manually or automatically upon the barcode identifier determining that the battery pack is not effective.

8. The battery pack function test device according to claim 1, wherein the test shelf comprises four or more channels to test the battery pack loaded on the carrier jig, and wherein the auxiliary shelf comprises two or more channels to hold the carrier jig without testing the battery pack loaded on the carrier jig, and
   wherein all the channels are aligned vertically.

9. The battery pack function test device according to claim 1, wherein a display part for outputting test results of the battery pack in real time is further mounted at one side of the testing part.

10. The battery pack function test device according to claim 1, wherein a test pin for testing the functions of the battery pack is located at one side of the test shelf, and wherein the test pin is automatically connected to the connector of the battery pack in response to operation of each of the jig fixing members.

11. The battery pack function test device according to claim 1, wherein a first clamping unit of the loading part is configured to selectively locate the carrier jig in any one empty channel selected from among the channels of the testing part.

12. The battery pack function test device according to claim 1, wherein a first clamping unit of the loading part is configured to first locate the carrier jig in a lowermost channel selected from among the channels of the testing part.

13. The battery pack function test device according to claim 1, wherein the unloading part comprises a second clamping unit for withdrawing the carrier jig, on which the battery pack is loaded, from the testing part after the functions of the battery pack have been tested and transferring the withdrawn carrier jig to the conveyor or a defective product discharging part, the second clamping unit including a tong to grip the carrier jig.

14. The battery pack function test device according to claim 13, wherein the second clamping unit is configured to be movable in an X-axis direction and in a Z-axis direction.

15. The battery pack function test device according to claim 13, wherein the defective product discharging part comprises:
   a transfer plate, on an upper surface of which a carrier jig, on which a defective battery pack transferred from the testing part by the second clamping unit is loaded, is loaded; and
   a third clamping unit for transferring the carrier jig, on which the battery pack is loaded, from the transfer plate to a defective battery pack stacking part.

16. The battery pack function test device according to claim 15, wherein the transfer plate is configured to be movable in a Y-axis direction, which is perpendicular to an X-axis direction and to a Z-axis direction, and wherein the transfer plate moves toward the conveyor to receive the carrier jig, on which the battery pack is loaded, from the second clamping unit upon determining that the battery pack is defective.

17. The battery pack function test device according to claim 15, wherein the defective battery pack stacking part is located at one side of the testing part and is configured to have a receiving structure in which carrier jigs on which battery packs determined to be defective products are loaded are sequentially stacked.

* * * * *